United States Patent
Ma et al.

(10) Patent No.: US 7,299,428 B2
(45) Date of Patent: Nov. 20, 2007

(54) MODEL STAMPING MATRIX CHECK TECHNIQUE IN CIRCUIT SIMULATOR

(75) Inventors: Yutao Ma, San Jose, CA (US); Bruce McGaughy, Fremont, CA (US); Zhihong Liu, Cupertino, CA (US)

(73) Assignee: Cadence Design Systems, Inc, San Jose, CA (US)

( * ) Notice: Subject to any disclaimer, the term of this patent is extended or adjusted under 35 U.S.C. 154(b) by 420 days.

(21) Appl. No.: 10/773,541

(22) Filed: Feb. 6, 2004

(65) Prior Publication Data
US 2005/0177807 A1   Aug. 11, 2005

(51) Int. Cl.
G06F 177/50   (2006.01)
(52) U.S. Cl. .............................. 716/4; 716/5
(58) Field of Classification Search .................. 716/4, 716/5
See application file for complete search history.

(56) References Cited

U.S. PATENT DOCUMENTS

| | | | | |
|---|---|---|---|---|
| 5,084,824 | A * | 1/1992 | Lam et al. ............... | 716/11 |
| 5,313,398 | A * | 5/1994 | Rohrer et al. ............ | 703/14 |
| 5,588,142 | A * | 12/1996 | Sharrit ..................... | 703/14 |
| 6,334,100 | B1 * | 12/2001 | Ahrikencheikh et al. .. | 703/14 |
| 2004/0049370 | A1 * | 3/2004 | Stanley et al. .......... | 703/14 |

OTHER PUBLICATIONS

Achar, R. et al., (May 2001). "Simulation of High-Speed Interconnects," *Proceeding of the IEEE* 89(5):693-728.
Bomhof, C. W. (2001). "Introduction," Chapter 1 *In Interative and Parallel Methods for Linear Systems, With Applications in Circuit Simulation*, located at <http://www.library.uu.nl/digiarchief/dip/diss/1957853/c1.pdf>, last visited on Jun. 15, 2004, 15 pages (Includes Table of Contents).
Devgan, A. (1995) "Efficient and Accurate Transient Simulation in Charge-Voltage Plane," International Conference on Computer Aided Design (ICCAD '95) Proceedings of the 1995 IEEE/ACM international conference on Computer-aided design, San Jose, California, United States, pp. 110-114.
Nguyen, T. V. et al., (1998). "Simulation of Coupling Capacitances Using Matrix Partitioning," International Conference on Computer Aided Design (ICCAD '98), Proceedings of the 1998 IEEE/ACM imternational conference on Computer-aided design, San Jose, California, United States pp. 12-18.
Schwarz, D. E. et al., (2000). "Structural Analysis For Electric Circuits and Consequences for MNA," *Int. J. Circ. Theor. Appl.* 28:131-162.
Krummenacher, F. et al., (Jul. 28, 2000). "RF EKV MOSFET Model Implementation," EPFL—Electronics Laboratories (LEG), EPF-Lausanne, Switzerland, Craft European Project No. 25710, Jul. 28, 2000, WP2, Deliverable D2.1, Ecole Polytechnique Federale de Lausanne 4 pages.
Zhou, X. (2000). "Multi-Level Modeling of Deep-Submicron Mosfets and ULSI Circuits," *9th International Conference on Mixed Design of Integrated Circuits and Systems, Mixdes 2002*, Wroclaw, Poland, Jun. 20-22, 2002, 7 pages.
Wroclaw, Poland, Jun. 20-22, 2002, 7 pages.

* cited by examiner

*Primary Examiner*—Leigh M. Garbowski
(74) *Attorney, Agent, or Firm*—Morrison & Foerster LLP

(57) ABSTRACT

The present invention includes a method for detecting model stamping errors during circuit simulation without the need for golden data. The method checks for model stamping errors by determining whether entries in model stamping matrices interrelate according to a plurality of preset rules before circuit equations are solved.

20 Claims, 5 Drawing Sheets

MODEL STAMPING MATRIX CHECK TECHNIQUE IN CIRCUIT SIMULATOR

The present invention relates to large sparse linear systems arising in the simulation of physical and other phenomena, such as an integrated circuit including circuit elements represented by matrix stamps in a system of matrix equations.

BACKGROUND

The development of complicated physical systems often requires powerful numerical simulation programs. For example, circuit simulation is now an essential part in the design flow of integrated circuits. It helps circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as, SPICE2 or SPICE3, also developed at UC Berkeley; HSPICE, developed by Meta-software and now owned by Synopsys; PSPICE, developed by Micro-Sim; and SPECTRE, developed by Cadence. The SPICE and its derivatives or enhanced versions will be referred to hereafter as SPICE circuit simulators, or SPICE.

An electronic circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE usually handles a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and solving the nodal equations. The circuit elements are modeled by device models, which produce model results that are represented in the circuit equations as matrix stamps.

A device model for modeling a circuit element, such as the BSIM4 model for modeling MOSFET devices developed by UC Berkeley, typically includes model equations and a set of model parameters to mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal i, $V_j$ (j=1, ..., n) represents the voltage or terminal bias across terminal j and a reference terminal, such as the ground, and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

For non-linear circuits, i.e., circuits including non-linear devices, SPICE often solves the circuit equations using the so-called Newton-Ralphson (N-R) iteration. To start the iteration process, SPICE selects an initial operating point for which the device model is evaluated. The initial operating point may include a set of terminal biases $V_j$ (j=1, ..., n) associated with each of a plurality of circuit elements. Based on the set of terminal biases for each of the circuit elements, SPICE evaluates the device models for modeling the circuit elements and produces model results such as terminal currents, node charges and the derivatives of the terminal currents and node charges (conductance and capacitance) associated with the circuit elements. SPICE then stamps the terminal currents, node charges, and their derivatives into designated entries in the matrices of the circuit equations. The process of obtaining model results and stamping the model results into matrices are often referred to as model evaluation and model stamping or matrix stamping. SPICE then solves the circuit equations to produce circuit voltages and currents based on the initial operating point. The circuit voltages and currents based on the initial guess of the operating point are used to generate a second operating point, and SPICE then iterates the above process to solve the circuit equations based on the second operating point. The iteration continues until the differences in circuit voltages and currents from two consecutive iteration rounds have fallen below some predetermined limits, and the solution is considered to have converged.

Thus, the correctness and the efficiency of circuit simulation depend on the correct implementation of the device models and correct stamping of the model results. For example, a basic requirement for the convergence of N-R iteration is the consistency between the terminal currents, node charges and their derivatives, which can be destroyed due to errors in the stamping of conductance or capacitance. As the technology advances and integrated circuits become more and more complex, it has become more and more difficult to guarantee the correct stamping of the model results. Usually, extensive model quality assurance (QA) procedures are followed after model evaluation to compare model results with golden data, which are obtained by measurements, by using a slower but more reliable simulation tool such as an electromagnetic field solver, or simply from a previous circuit simulation run. But this model QA method is disadvantageous because it depends on the quality of the golden data, which may be erroneous or simply unavailable, as in cases involving new technology and state-of-art device models.

Even when the golden data are available and reliable, conventional model QA procedures are still insufficient because the golden data are typically obtained by DC sweep of bias voltages and because conventional model QA procedures often use DC solution of the model equations for comparison with the golden data. As a result, conventional model QA procedures cannot detect errors in matrix stamping of conductance or capacitance entries because these errors have no effect on the accuracy of DC solutions. The errors in matrix stamping of conductance or capacitance entries will, however, affect the convergence and speed of the circuit simulation and should be detected before they are used to solve the circuit equations.

Furthermore, conventional model QA procedures are insufficient because they do not provide 100% bias coverage. The DC solution of the model equations and the comparison with golden data are usually performed for typical biases only. Moreover, conventional mode QA procedures do not test the consistency between currents, charges and their derivatives (conductance and capacitance), which is crucial for the convergence of N-R iteration.

SUMMARY

The present invention includes a method for detecting model stamping errors during circuit simulation. In one embodiment of the present invention, the method is implemented in a circuit simulator for simulating an integrated circuit having various interconnected circuit elements. The circuit simulator includes a model engine module (model engine) and a solver module (solver). The model engine includes device models for modeling the circuit elements and is programmed to produce model results associated with a circuit element based on the set of terminal biases for the circuit element supplied by the solver. The solver is programmed to form circuit equations in matrix format, to supply the set of terminal biases for each of a plurality of circuit elements represented in the circuit equations to the model engine, to receive the model results produced by the model engine, to stamp the model results into designated entries in matrices associated with the circuit equations, to check for correctness of the stamped model results by determining whether the model results interrelate according to a plurality of preset rules, and to solve the circuit equations to produce circuit simulation results.

DETAILED DESCRIPTION

The present invention includes a method for simulating a system by solving for the states of the system having a large number of elements interconnected through their terminals, some or all of which are modeled by element models each for generating model results describing the behavior or characteristic of an element in the system under a set of terminal conditions. An example of such a system is an integrated circuit having various interconnected circuit elements. Preferred embodiments of the present invention are thus described in the context of integrated circuits. But the present invention is applicable to the simulation of any system having interconnected elements when the simulation is carried out by solving system equations in matrix format and the elements in the system are represented in the system equations as matrix stamps.

Figure 1:
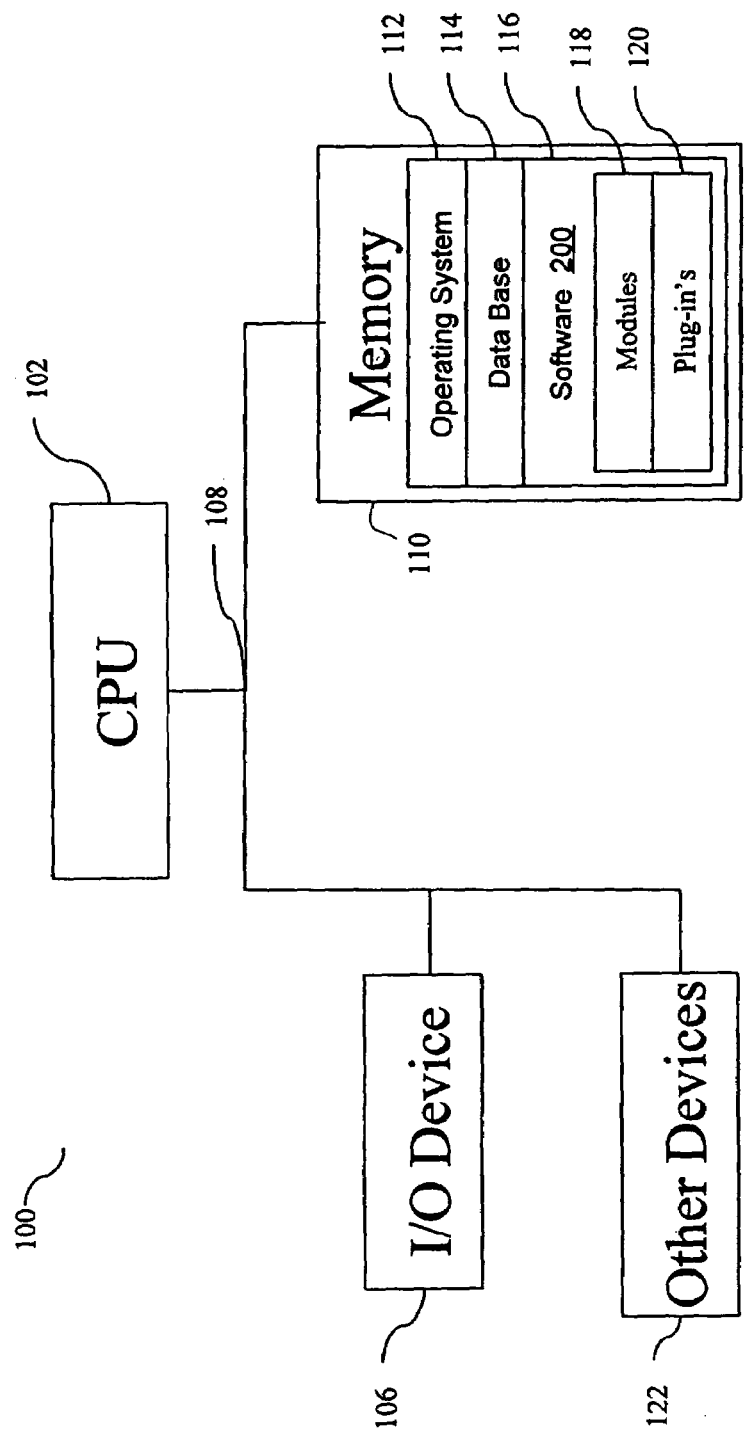
FIG. 1 is a block diagram of a computer system that can be used to carry out a method according to one embodiment of the present invention.

FIG. 1 illustrates a computer system (system) 100 that can be used to carry out the method according to one embodiment of the present invention. As shown in FIG. 1, the computer system (system) 100 includes a central processing unit (CPU) 102, and a disk memory 110 coupled to the CPU 102 through a bus 108. The system 100 further includes a set of input/output (I/O) devices 106, such as a keypad, a mouse, and a display device, also coupled to the CPU 102 through the bus 108. The system 100 may also include other devices 122, such as an input port for receiving data from a computer network or from a data collecting device (not shown). An example of system 100 is a Pentium 133 PC/Compatible computer having a RAM larger than 64 MB and a hard disk larger than 1 GB.

Memory 110 has computer readable memory spaces such as memory space 112 that stores operating system 112 such as Windows 95/98/NT4.0/2000, which has instructions for communicating, processing, accessing, storing and searching data. Memory 110 further includes a database 114 that stores data and/or data structures used to carry out the circuit simulation program according to one embodiment of the present invention, and memory space 116 that stores program instructions (software) of a circuit simulation program 200 according to one embodiment of the present invention. Memory space 116 may be further subdivided as appropriate, for example to include memory portions 118 and 120 for storing modules and plug-in models, respectively, of the software.

Figure 2:
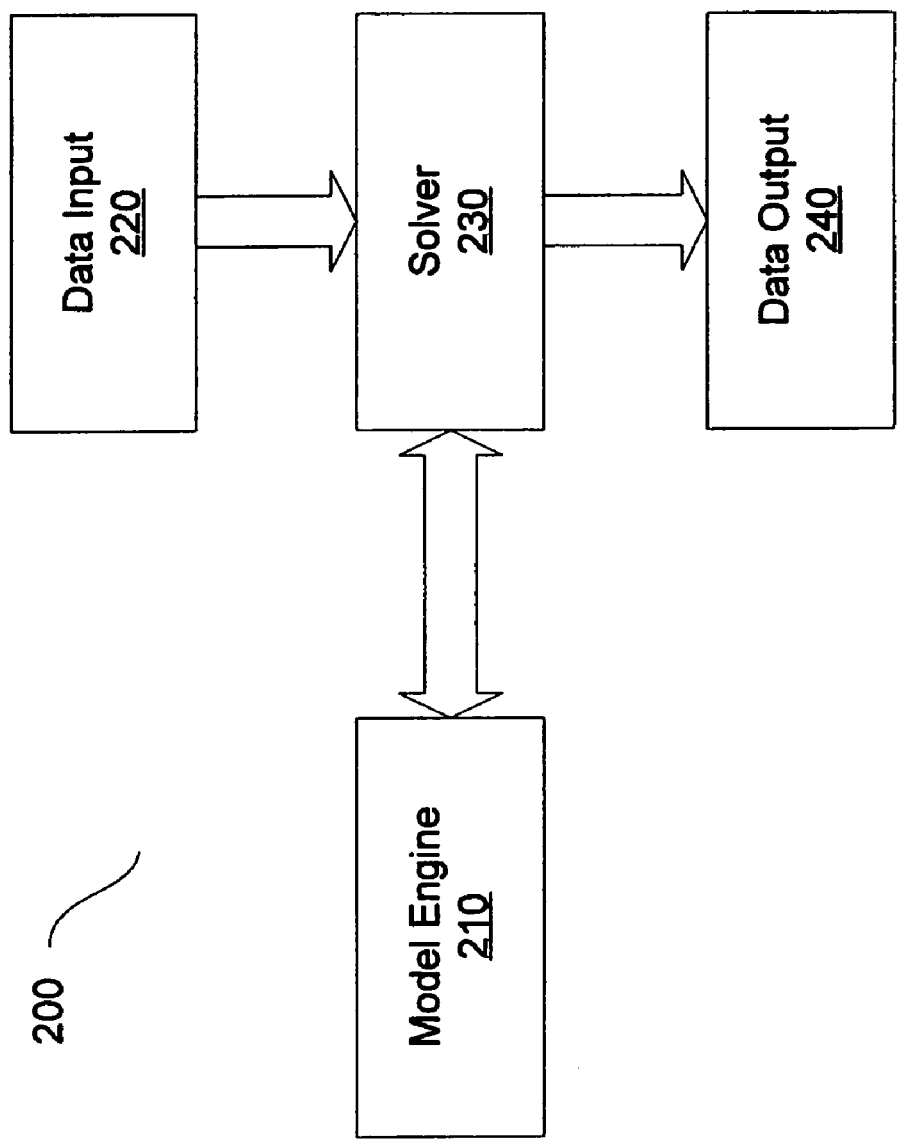
FIG. 2 is a block diagram illustrating a circuit simulation program according to one embodiment of the present invention.

As shown in FIG. 2, in one embodiment of the present invention, the method for simulating an integrated circuit (or circuit) having various interconnected circuit elements is implemented in a circuit simulation program 200 having a model engine module (model engine) 210 and a solver module (solver) 230. The model engine 210 includes device models for modeling the circuit elements and is programmed to produce model results associated with a circuit element based on a set of terminal biases for the circuit element supplied by the solver 230. The solver 230 is programmed to form circuit equations in matrix format, to supply the set of terminal biases for each circuit element represented in the circuit equations to the model engine, to receive the model results produced by the model engine, to stamp the model results into designated entries in matrices associated with the circuit equations, to check for correctness of the model results by determining whether the model results interrelate according to a plurality of preset rules, and to solve the circuit equations to produce circuit simulation results. The circuit simulation program may also include a data input module 220 that arranges input data describing the circuit to be simulated in proper format or data structures, such as a netlist, for use by the solver, and a data output module 240 that arranges simulation results in proper format for display and use by circuit design engineers.

Figure 3:
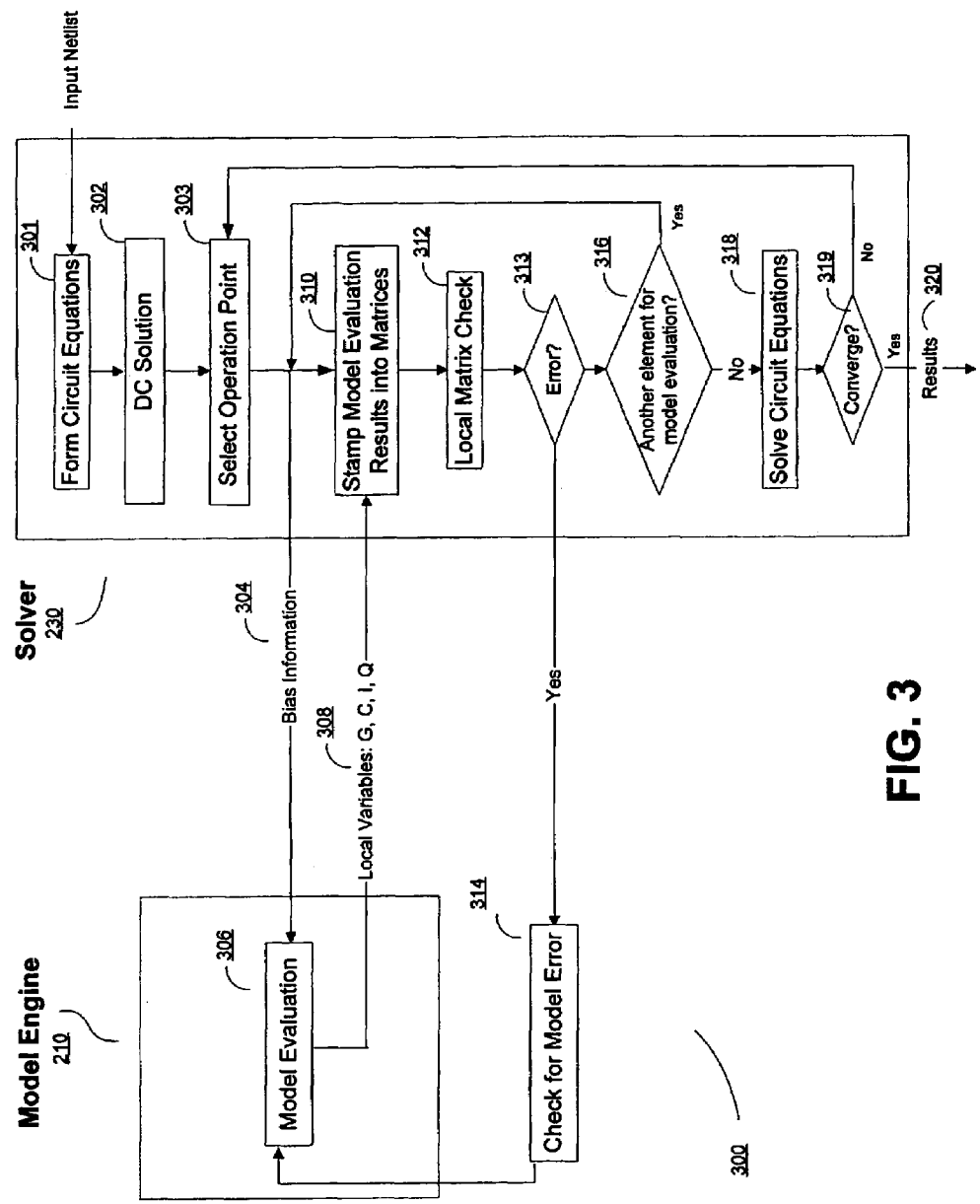
FIG. 3 is a flowchart illustrating a process for simulating an integrated circuit according to one embodiment of the present invention.

FIG. 3 illustrates a process 300 performed by the solver 230 and the model engine 210 during the simulation of the integrated circuit. As shown in FIG. 3, in process 300, the solver 230 forms in step 301 the circuit equations according to an input netlist from the data input module 220. The circuit equations are formed in a matrix format and have at this point associated matrices with unfilled entries. Then, in order to form an initial operating point for the N-R solution of the circuit equations, the solver performs direct current (DC) simulation of the circuit in step 302. In DC simulation, AC sources are ignored, capacitors are replaced with open circuits and inductors with short circuits, and nonlinear devices are represented by their associated device models, and the simulator uses the Newton-Raphson algorithm to solve Kirchoff's Current Law at each node.

The result of the DC simulation is a DC operating point of the circuit, which is selected in step 303 by the solver as the initial operating point. The initial operating point includes currents and node voltages in the circuit, from which the solver forms a set of terminal conditions such as terminal biases for a circuit element and supplies the set of terminal biases in step 304 to the model engine 210. The set of terminal biases may include information such as a terminal bias voltage between each terminal of the circuit element and the ground, or a terminal bias voltage between a reference terminal selected among the terminals of the circuit element and each of the other terminals of the circuit element. Thus, if the circuit element is a device having n terminals, the set of terminal biases may include $\{V_1, \ldots, V_n\}$, where $V_i$ represents the terminal bias voltage between terminal i and the ground or the terminal bias voltage between terminal i and a reference terminal such as terminal n (in this case $V_n=0$).

Upon receiving the set of terminal biases, the model engine performs at step 306 model evaluation, and produces model results (or local variables) such as terminal currents, node charges, conductance and capacitance, etc., associated with the circuit element. The model results are communicated at step 308 to the solver. The solver then stamps the model results into designated entries in the matrices associated with the circuit equations in step 310. During the stamping in step 310, the model results or local variables are also arranged and stored as local variable matrices. For example, when the model results are for a circuit element with n terminals, the terminal currents or node charges are arranged as a local current vector I or local charge vector Q, respectively, $$I = \begin{bmatrix} I_1 \\ \vdots \\ I_n \end{bmatrix}, \text{ or } Q = \begin{bmatrix} Q_1 \\ \vdots \\ Q_n \end{bmatrix},$$

where $I_i$ represents the current entering terminal i, and $q_i$ represents the charge at terminal i, where $i=1, \ldots, n$. Similarly, the conductance or capacitance associated with each pair of terminals of the circuit element is stores as a local conductance G or capacitance matrix C, respectively, $$G = \begin{pmatrix} G_{11} & \cdots & G_{1n} \\ \vdots & \ddots & \vdots \\ G_{n1} & \cdots & G_{nn} \end{pmatrix}, \text{ or } C = \begin{pmatrix} C_{11} & \cdots & C_{1n} \\ \vdots & \ddots & \vdots \\ C_{n1} & \cdots & C_{nn} \end{pmatrix},$$

where $G_{ij}$ and $C_{ij}$ represents the conductance and capacitance, respectively, associated with terminals i and j, where $j=1, \ldots, n$.

The solver then checks at step 312 for correctness of the model results by determining whether the model results interrelate according to a plurality of preset rules. The step 312 may involve both the solver and the model engine in order to determine whether the model results interrelate according to some of the plurality of preset rules, as discussed below. If it is determined that the model results violate one or more of the plurality of preset rules in step 313, the solver prompts for a model error check, which is done at step 314 either manually or automatically using a separate computer program module. After checking for correctness of the model results, the solver proceeds to step 316 in which the solver determines if another circuit element also needs model evaluation.

If the solver determines that there is a second circuit element for which a device model needs to be evaluated, the solver obtains the a set of terminal biases for the second circuit element based on the initial operating point and goes back to step 304 to provide the set of terminal biases associated with the second circuit element to the model engine, which then performs model evaluation for the second circuit element at step 306 and provides the model results for the second circuit element to the solver at step 308. The solver again stamps the model results into matrices in step 310 and checks the correctness of the model results for the second circuit element in step 312 to determine whether the results are interrelated according to the plurality of preset rules. If they are not, the solver again prompts for model error check. The solver then determines in step 316 if a third circuit element needs model evaluation.

Steps 304 through 316 are thus repeated until the solver determines that no more circuit elements need model evaluation or the matrices associated with the circuit equations are filled. The solver then proceeds to obtain solutions of the states of the circuit by solving the circuit equations at step 318. In one embodiment of the present invention, the solutions of the circuit equations include currents and node voltages in the circuit.

Steps 303 through 318 are iterated until the solver determines that a convergence has been reached in step 319. During the iteration, the solution of the circuit equations in each iteration round is used to form the operating point for the next iteration round in step 303, and a convergence is considered to have been reached in step 319 when the difference between the solutions of two consecutive iteration rounds are below some preset limits. When the convergence is reached, the solver outputs the simulation results at step 320.

In one embodiment of the present invention, the plurality of the preset rules may include some or all of the following rules:
1. The sum of the entries in the current vector is zero;
2. The sum of the entries in the charge vector is zero;
3. The sum of the entries in each row of the conductance matrix is zero;
4. The sum of the entries in each column of the conductance matrix is zero;

5. The sum of the entries in each row of the capacitance matrix is zero;
6. The sum of the entries in each column of the capacitance matrix is zero;
7. Each diagonal entry in the conductance matrix is non-negative;
8. Each diagonal entry in the capacitance matrix is non-negative;
9. Each entry in the conductance matrix is the derivative of a corresponding entry in the terminal current vector with respect to a corresponding terminal bias voltage, i.e., $$G_{ij} = \frac{\partial I_i}{\partial V_j};$$

10. Each entry in the capacitance matrix is the derivative of a corresponding entry in the terminal charge vector with respect to a corresponding terminal bias voltage, i.e., $$C_{ij} = \frac{\partial Q_i}{\partial V_j}.$$

Rule #1 and Rule #2 can be used to test if the terminal currents and node charges of all the nodes associated with the circuit element are conservative. Rule #3 through Rule #6 can be used to test if the conductance and capacitance associated with each pair of the terminals of the circuit element are calculated correctly. Rule #7 and Rule #8 can be used to test if there are any non-physical results, such as negative resistor or negative capacitor, in the model results. Rule #9 can be used to check the consistency between the conductance associated with any pair of terminals and the corresponding terminal current. Rule #10 can be used to check the consistency between the capacitance associated with any pair of terminals and the corresponding node charge.

Rule #1 through #10 are applicable to any device model when an equivalent circuit associated with the device model includes only resistors, capacitors, and voltage-controlled current sources and when the circuit element being modeled by the device model has no external connections other than those through the terminals of the circuit element. Thus, Rule #1 through #10 are applicable to all of the compact models currently available for circuit simulation, such as the device models for active devices including MOSFETs, BJTs, JFETs, MESFETs, DIODEs, TFTs, and passive devices including resistors, capacitors, etc.

Figure 4:
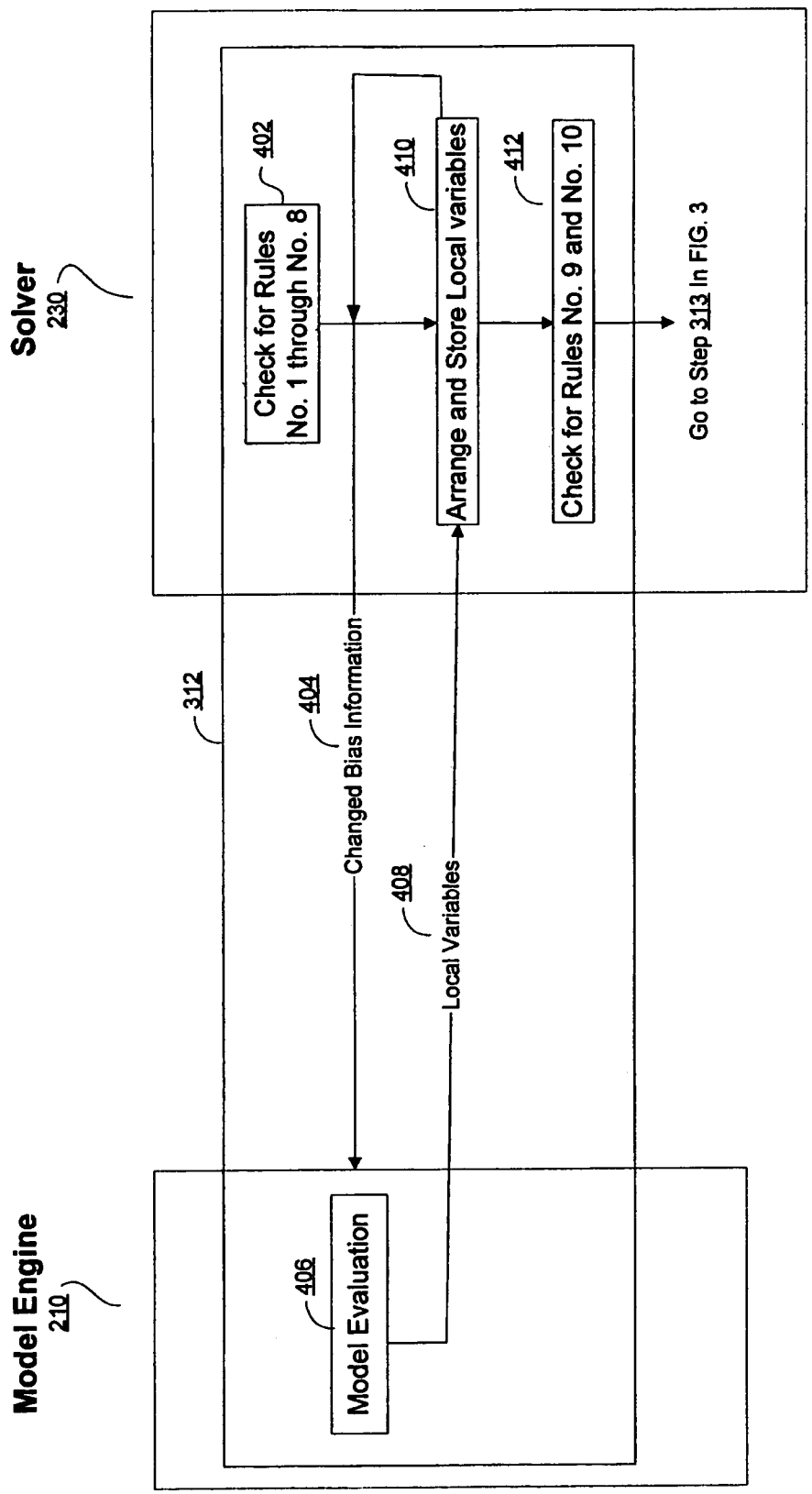
FIG. 4 is a flowchart illustrating a process for checking local variable matrices according to one embodiment of the present invention.

FIG. 4 illustrates in further detail step 312 for checking the local variable matrices, such as I, Q, G, C, according to one embodiment of the present invention. As shown in FIG. 4, step 312 includes step 402 in which the local matrices are checked to see if they conform or substantially conform to some or all of Rule #1 through Rule #8, as stated above. When only substantial conformation is required, the sum of entries in the current vector, for example, does not have to be exactly zero to conform to Rule #1. When the sum of entries in the current vector is close to zero so that the difference between the sum of entries in the current vector and zero is within a predetermined limit, the local matrices are considered to substantially conform to Rule #1. The same is true for Rule #2 through #6 for substantial conformation.

If Rule #9 and Rule #10 are to be checked, step 312 further includes steps 404, 406, 408, 410 and 412, which are performed for each terminal j, j=1, 2, . . . , n, of the circuit element. In step 404, terminal bias $V_j$ corresponding to terminal j is changed slightly to $V_j+\Delta V_j$ in the set of terminal biases and the changed set of terminal biases $\{V_1, \ldots, V_j+\Delta V_j, \ldots, V_n\}$, where j=1, 2, . . . , n, is supplied to the model engine. Upon receiving the changed set of terminal biases, the model engine performs model evaluation in step 406 and produces model results based on the changed terminal biases to the solver. Upon receiving the model results in step 408, the solver arranges and stores the model results in step 410 as a new set of local variable matrices I', Q', G', C', and conformation with Rule 9 and/or Rule 10 are checked in step 512 by verifying that $$G_{ij} = \frac{\partial I_i}{\partial V_j} \cong \frac{I_i - I'_i}{\Delta V_j}, \quad \text{and/or} \quad C_{ij} = \frac{\partial Q_i}{\partial V_j} \cong \frac{Q_i - Q'_i}{\Delta V_j}.$$

When $\Delta V_j$ is small enough, $G_{ij}$ should exactly equal to $$\frac{I_i - I'_i}{\Delta V_j}$$

and $C_{ij}$ should exactly equal to $$\frac{Q_i - Q'_i}{\Delta V_j}$$

if there is no error with model evaluation. Again, in some applications, only substantial conformation with Rule #9 and Rule #10 are required, and Rule #9 and Rule #10 are considered being substantially conformed with when the difference between $G_{ij}$ and $$\frac{I_i - I'_i}{\Delta V_j}$$

and the difference between $C_{ij}$ and $$\frac{Q_i - Q'_i}{\Delta V_j}$$

are within predetermined limits.

Thus, the present invention includes a self-contained method to insure the correctness of model stamping matrix without the need for golden data. The method is carried out during circuit simulation before circuit equations are solved. So, compared with prior art model QA techniques, which are standalone techniques performed after circuit simulation by comparing the simulation results with golden data, the present invention is more advantageous because it directly detects errors in model stamping matrix before solving the circuit equations. Also, without relying on golden data, the present invention provides a method to check for model evaluation errors over all applicable bias ranges. The method can also be used to check for inconsistency between terminal currents, node charges and their derivatives, i.e., conductance and capacitance, so that convergence problems associated with such inconsistencies can be avoided.

Figure 5:
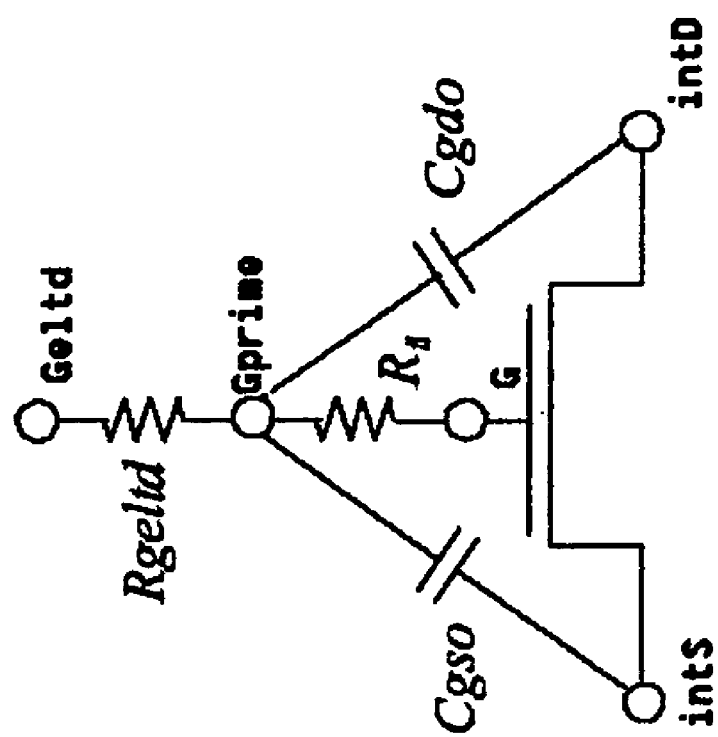
FIG. 5 is an equivalent circuit in the BSIM4 model for modeling MOSFET devices for illustrating an application of the present invention.

To illustrate an application of the present invention, consider a gate resistance network in the BSIM4 model for modeling MOSFET devices, as shown in FIG. 5. The gate resistance network includes 5 nodes, Geltd, Gprime, G. intS, and intD, a resistor Rgeltd between node Geltd and node Gprime, a resistor $R_{ii}$ between node Gprime and node G, a capacitor Cgso between node Gprime and node intS, and a capacitor Cgdo between node Gprime and node intD. The charges associated with the capacitors Cgso and Cgdo should be calculated as in the following:

$$Qgdo = Cgdo \times (V_{Gprime} - V_{int\,D}), \text{ and}$$

$$Qgso = Cgso \times (V_{Gprime} - V_{int\,S}),$$

where Qgdo and Qgso are the charges associated with the capacitors Cgso and Cgdo, respectively, and $V_{Gprime}$, $V_{intD}$, and $V_{intS}$ are the terminal bias voltages for nodes Gprime, intD, and intS, respectively. If Qgdo and Qgso are incorrectly calculated during model evaluation, such as in the following:

$$Qgdo = Cgdo \times (V_G - V_{int\,D}), \text{ and}$$

$$Qgso = Cgso \times (V_G - V_{int\,S}),$$

where $V_G$ is the terminal bias voltage for node G, the incorrect calculation would cause inconsistency between Qgdo and Cgdo and between Qdso and Cgso and thus convergence problems in N-R iteration. This inconsistency cannot be detected using conventional model QA techniques but can be easily discovered using the present invention because the model results would violate Rule #10, as stated above.

We claim:

1. A method for evaluating a device model for a circuit element, comprising:
   supplying a first set of terminal biases associated with the circuit element;
   obtaining a first set of model results based on the first set of terminal biases;
   checking for correctness of the first set of model results by determining whether the first set of model results interrelate according to a plurality of rules; and
   storing the first set of model results in a memory device.

2. The method of claim 1 wherein the first set of model results include a current vector having a plurality of entries, and wherein determining whether the model results interrelate according to the plurality of rules comprises determining whether the sum of the plurality of entries in the current vector is zero.

3. The method of claim 1 wherein the first set of model results include a charge vector having a plurality of entries, and wherein determining whether the first set of model results interrelate according to the plurality of rules comprises determining whether the sum of the plurality of entries in the charge vector is zero.

4. The method of claim 1 wherein the first set of model results include a conductance matrix having a plurality of rows of entries, and wherein determining whether the first set of model results interrelate according to the plurality of rules comprises determining whether the sum of the entries in each of the plurality of rows of entries is zero.

5. The method of claim 1 wherein the first set of model results include a conductance matrix having a plurality of columns of entries and wherein determining whether the first set of model results interrelate according to the plurality of rules comprises determining whether the sum of the entries in each of the plurality of columns of entries is zero.

6. The method of claim 1 wherein the first set of model results include a capacitance matrix having a plurality of rows of entries, and wherein determining whether the first set of model results interrelate according to the plurality of rules comprises determining whether the sum of the entries in each of the plurality of rows of entries is zero.

7. The method of claim 1 wherein the first set of model results include a capacitance matrix having a plurality of columns of entries, and wherein determining whether the first set of model results interrelate according to the plurality of rules comprises determining whether the sum of the entries in each of the plurality of columns of entries is zero.

8. The method of claim 1 wherein the first set of model results include a conductance matrix having a plurality of diagonal entries, and wherein determining whether the first set of model results interrelate according to the plurality of rules comprises determining whether each diagonal entry is non-negative.

9. The method of claim 1 wherein the first set of model results include a capacitance matrix having a plurality of diagonal entries, and wherein determining whether the first set of model results interrelate according to the plurality of rules comprises determining whether each diagonal entry is non-negative.

10. The method of claim 1 wherein the first set of model results are stamped into designated positions in matrices associated with equations for simulating the circuit element.

11. The method of claim 1, wherein checking for correctness of the first set of model results further comprises:
    supplying a second set of terminal biases that is slightly different from the first set of terminal biases;
    obtaining a second set of model results based on the second set of terminal biases; and
    checking for correctness of the first set of model results based on differences between the first set of model results and the second set of model results and on differences between the first set of terminal biases and the second set of terminal biases.

12. The method of claim 11 wherein all except one of the second set of terminal biases are equal to respective ones of the first set of terminal biases.

13. A method for simulating a system having a large number of elements interconnected through their terminals, some or all of the elements are modeled by element models each for generating model results describing characteristic of an element under a set of terminal conditions; comprising:
    obtaining a first set of model results associated with an element in the system based on a first set of terminal conditions for the element;
    checking for correctness of the first set of model results by determining whether the first set of model results interrelate according to a plurality of rules; and
    storing the first set of model results in a memory device.

14. The method of claim 13 wherein the model results are stamped into designated entries in matrices associated with a set of matrix equations that simulate the system and the method further comprising:
    obtaining solutions for states of the system by solving the set of matrix equations.

15. The method of claim 14, further comprising:
forming a second set of terminal conditions for the element based on the solutions for the states of the system;
obtaining a second set of model results associated with the element based on the second set of terminal conditions for the element; and
checking for correctness of the second set of model results by determining whether the second set of model results interrelate according to the plurality of rules.

16. A computer readable medium storing therein computer readable program instructions that, when executed by a computer, cause the computer to perform a method for evaluating a device model for a circuit element, the computer readable program instructions comprising:
instructions for supplying a first set of terminal biases;
instructions for obtaining a first set of model results based on the first set of terminal biases;
instructions for checking for correctness of the first set of model results by determining whether the first set of model results interrelate according to a plurality of rules; and
instructions for storing the first set of model results in a memory device.

17. The computer readable medium of claim 16 wherein the first set of model results include a current vector and a charge vector each having a plurality of entries, and wherein the instructions for determining whether the model results interrelate according to the plurality of rules comprises:
instructions for determining whether the sum of the plurality of entries in the current vector is zero; and
instructions for determining whether the sum of the plurality of entries in the charge vector is zero.

18. The computer readable medium of claim 16 wherein the first set of model results include a conductance matrix and a capacitance matrix each having a plurality of rows of entries and a plurality of columns of entries, and wherein the instructions for determining whether the first set of model results interrelate according to the plurality of rules comprises:
instructions for determining whether the sum of the entries in each of the plurality of rows of entries in the conductance matrix is zero;
instructions for determining whether the sum of the entries in each of the plurality of columns of entries in the conductance matrix is zero;
instructions for determining whether the sum of the entries in each of the plurality of rows of entries in the capacitance matrix is zero;
instructions for determining whether the sum of the entries in each of the plurality of columns of entries in the capacitance matrix is zero;
instructions for determining whether each diagonal entry in the conductance matrix is non-negative; and
instructions for determining whether each diagonal entry in the capacitance matrix is non-negative.

19. The computer readable medium of claim 16, wherein the instructions for checking for correctness of the first set of model results further comprises:
instructions for supplying a second set of terminal biases that is slightly different from the first set of terminal biases;
instructions for obtaining a second set of model results based on the second set of terminal biases; and
instructions for checking for correctness of the first set of model results based on differences between the first set of model results and the second set of model results and on differences between the first set of terminal biases and the second set of terminal biases.

20. The computer readable medium of claim 19 wherein all except one of the second set of terminal biases are equal to respective ones of the first set of terminal biases.

* * * * *